United States Patent
Hong

[11] Patent Number: 6,146,940
[45] Date of Patent: Nov. 14, 2000

[54] METHOD OF FABRICATING A DYNAMIC RANDOM ACCESS MEMORY DEVICE

[75] Inventor: Gary Hong, Hsinchu, Taiwan

[73] Assignee: United Microelectronics Corp., Taiwan

[21] Appl. No.: 09/000,967

[22] Filed: Dec. 30, 1997

[30] Foreign Application Priority Data

Dec. 12, 1997 [TW] Taiwan ................................ 86118758

[51] Int. Cl.7 ...................... H01L 21/8242; H01L 21/368
[52] U.S. Cl. .......................... 438/253; 438/255; 438/396; 438/398
[58] Field of Search ..................... 438/244, 397, 438/396, 253, 254, 255, 398, 239

[56] References Cited

U.S. PATENT DOCUMENTS

| | | | |
|---|---|---|---|
| 5,429,956 | 7/1995 | Shell et al. | 437/29 |
| 5,554,557 | 9/1996 | Koh | 437/52 |
| 5,565,376 | 10/1996 | Lur et al. | 437/67 |
| 5,583,358 | 12/1996 | Kimura et al. | 257/306 |
| 5,696,036 | 12/1997 | Su et al. | 438/239 |
| 5,872,041 | 2/1999 | Lee et al. | 438/397 |

*Primary Examiner*—Mary Wilczewski
*Assistant Examiner*—Calvin Lee
*Attorney, Agent, or Firm*—Rabin & Champagne PC

[57] ABSTRACT

A method of fabricating a dynamic random access memory is disclosed, which mainly utilizing selective liquid-phase deposition process to form an insulation layer on the gate electrode structure.

15 Claims, 5 Drawing Sheets

METHOD OF FABRICATING A DYNAMIC RANDOM ACCESS MEMORY DEVICE

CROSS-REFERENCE TO RELATED APPLICATION

This application claims the priority benefit of Taiwan application serial no. 86118758, filed Dec. 12, 1997, the full disclosure of which is incorporated herein by reference.

BACKGROUND OF THE INVENTION

Field of the Invention

This invention relates in general to a method of fabricating a dynamic random access (DRAM) memory device, and more particularly to a method of fabricating a DRAM with precise contact opening.

Referring to FIG. 1, on a p-type substrate 10, at least one field region is defined so that the active region for forming devices is isolated by field oxide 11. Then, a gate oxide layer, a polysilicon layer and a cap oxide layer are successively formed on the substrate 10. Theses layers are then defined to a gate electrode structure including: a gate oxide layer 12, a polysilicon layer 13 and a cap oxide layer 14 shown in FIG. 1. Next, a oxide spacer structure 15 is formed at the periphery of the gate electrode structure. The self-aligned process is then performed to form source/drain regions 16a, 16b on the substrate 10 and therefore a MOS transistor is completed.

Next, as shown in FIG. 1B, a blanket insulating layer 17, such as an oxide layer, is formed on the substrate 10 and the gate electrode structure. A photoresist layer 18 is formed over the insulating layer 17. The insulating layer 17 is then patterned by exposure, development and the related processes to form a self-aligned contact 19, exposing one of the source/drain regions, for example, source/drain region 16a, as in FIG. 1C. Finally, a conductive layer 20 is formed to fill the contact opening 19 and then patterned to form a lower electrode. The conductive layer 20 can be a doped polysilicon layer.

In the above-mentioned conventional process, the insulating material in the contact opening has to be completely removed by the self-align etching process so that over-etching step is usually utilized to ensure the formation of the contact window. However, the cap oxide 14a is usually partially etched and a portion of the insulating material 17a is usually left on the oxide spacer 15 in the contact window 19, covering partially the surface of the source/drain regions 16a. As a result, the electrically coupling contact area of the conductive layer and source/drain region shrinks. Under the requirement of high integrated circuit (IC) integrity, the size of each device has to be decreased. However, the formation of the residue insulating layer 17a along the oxide spacer makes the formation of the contact window even more difficult and size-shrinking of self-align contact window results in high contact resistance. Consequently, the difficulties in processing results in low yield of high density DRAM. Over-etching of the cap oxide makes insufficient isolation effect between the gate electrode and the conductive layer and therefore reduce the reliability.

SUMMARY OF THE INVENTION

It is therefore an object of the present invention to provide a method of forming an insulating layer on the gate electrode structure, using a selective liquid-phase deposition process to prevent the occurrence of residue insulating material on the gate electrode structure which results in contact window area shrinking as conventional photolithography technique is used. The method of the invention improves the isolation effect of the cape oxide between the gate polysilicon layer and the conductive layer. Consequently, the reliability and the yield of the high density DRAM device are increased.

A method of forming a silicon oxide layer is provided. On a substrate, at least one MOS transistor is formed and the MOS transistor has source/drain regions. A photoresist layer is formed on the substrate, covering one of the source/drain regions, exposing a portion of the substrate surface. An oxide layer is selectively formed over the exposed portion of the substrate surface by liquid-phase deposition. The photoresist layer is removed to expose the one of the source/drain regions. A first polysilicon layer is formed and patterned on the substrate, the first polysilicon layer is electrically coupled to the one of the source/drain regions to serve as a lower electrode of the capacitor. A dielectric layer is formed on the first polysilicon layer. A second polysilicon layer is formed on the dielectric layer to serve as a lower electrode of the capacitor.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
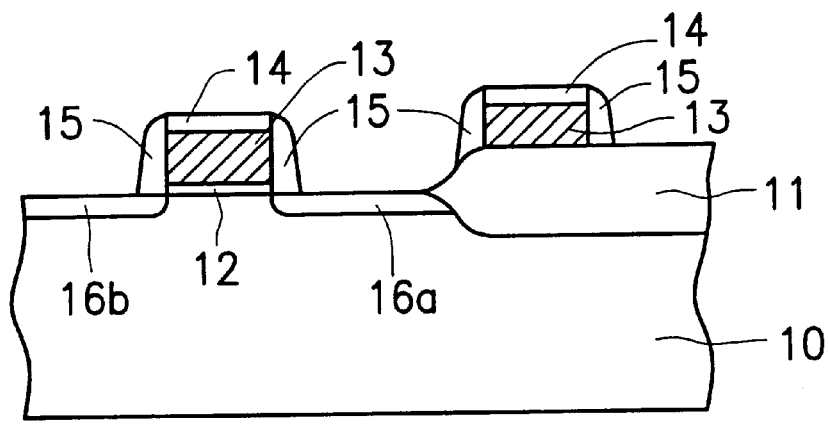
FIGS. 1A to 1D (Prior Art) are cross-sectional views showing a conventional process of fabricating a DRAM device.
Figure 1B:
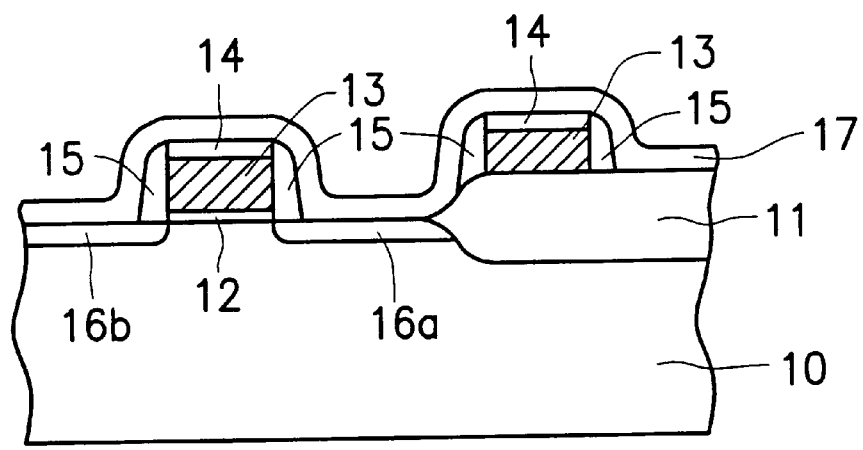
Figure 1C:
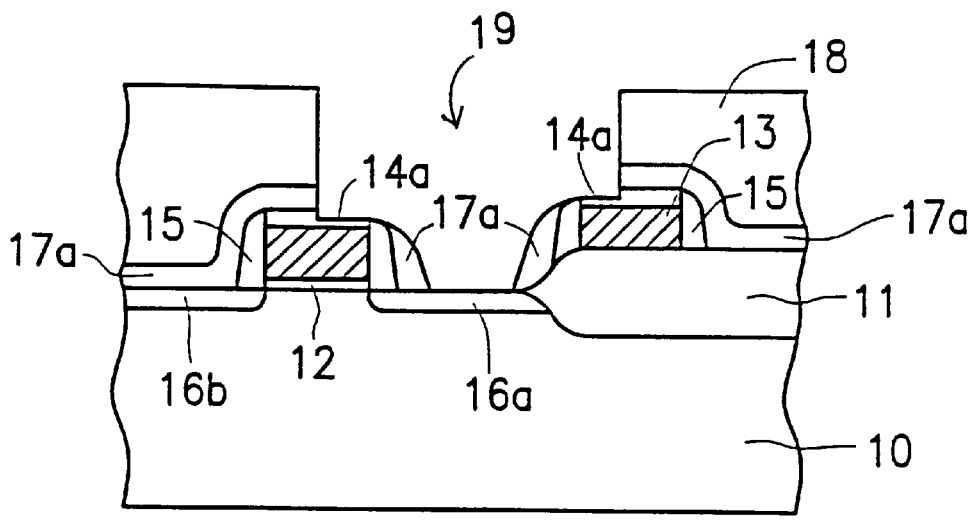
Figure 1D:
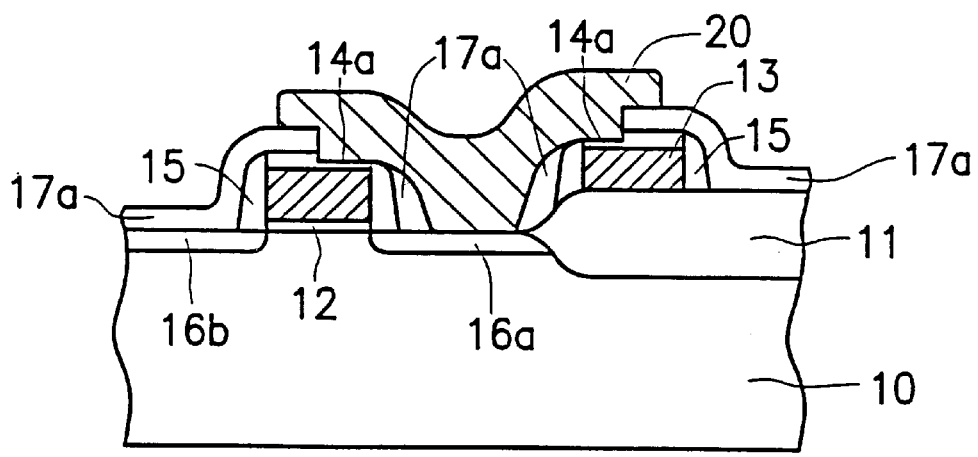
Figure 2A:
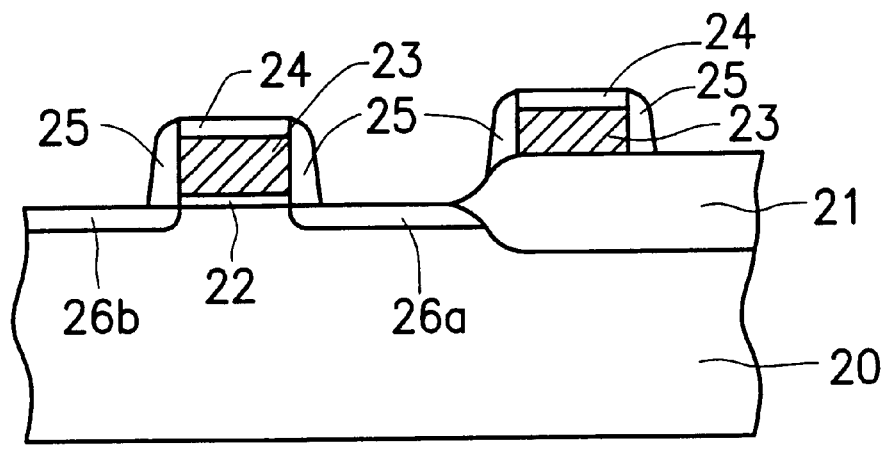
FIGS. 2A to 2D are cross-sectional views showing the process steps of forming a DRAM device in accordance with the preferred embodiment of the invention.

Referring to FIG. 2A, a device isolation structure 21 is first formed adjacent an active region on a silicon substrate 20. The device isolation structure 21 can be formed, for example, by performing a thermal oxidation, forming a field oxide layer with a thickness of about 3000 Å, using local oxidation or alternatively forming shallow trenches as an isolation structure. Next, the silicon substrate 20 is delivered into an oxidation furnace, using dry thermal oxidation to form a gate oxide layer 22 over the silicon substrate 20. The thickness of the gate oxide layer 22 is about 100–250 Å. A polysilicon layer 23 is then formed, for example, by low pressure chemical vapor deposition (LPCVD). Thermal diffusion or ion implantation is used to implant impurities into the polysilicon layer 23 to reduce its resistivity and increase conductivity. The polysilicon layer 23 has a thickness of about 2000–3000 Å. Then, a cap oxide layer 24 is formed over the polysilicon layer. The cap oxide layer 24, polysilicon layer 23 and gate oxide layer 22 are defined by photolithography and etching to form a gate electrode structure of a MOS device.

Next, a blanket oxide layer can be formed by chemical vapor deposition. The thickness of the blanket oxide layer can be substantially equal to the thickness of the desired oxide spacer 25. The blanket oxide layer is further etched back by anisotropic plasma etching, for example, using $CF_4$ or other compounds containing fluorine as gas source, to form a desired oxide spacer 25. The cap oxide layer 24 and the oxide spacer 25 prevent the polysilicon layer 23 gate electrode from undesired contact with the conductive layer formed in the continuous process. Then, a self-aligned ion implantation process is performed in the substrate 20 to form source/drain regions 26a, 26b of the MOS transistor, using the oxide spacer 25 as a mask, wherein the concentration of the ion implanted is about $10^{15}/cm^2$. Alternatively, before the formation of the oxide spacer 25, an ion implantation process is performed to form a lightly doped region self-aligned to the peripheries of the gate electrode and then the above-mentioned heavily doped process is performed to form a LDD structure.

Figure 2B:
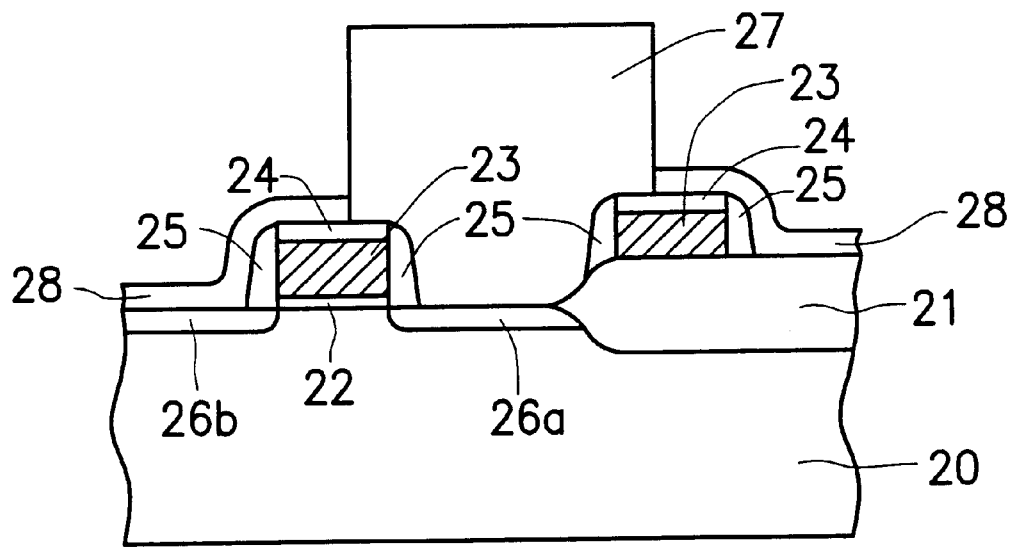

Next, on a substrate 20 having at least a MOS transistor formed thereon, a mask layer 27, such as a photoresist layer, is formed to cover one of the source/drain regions 26a of the MOS transistor and partially cover the gate electrode structure, as shown in FIG. 2B. Then, over the uncovered portion of the substrate 20 and a portion of the gate electrode structure, an oxide layer 28 is deposited, using liquid-phase deposition.

Figure 3:
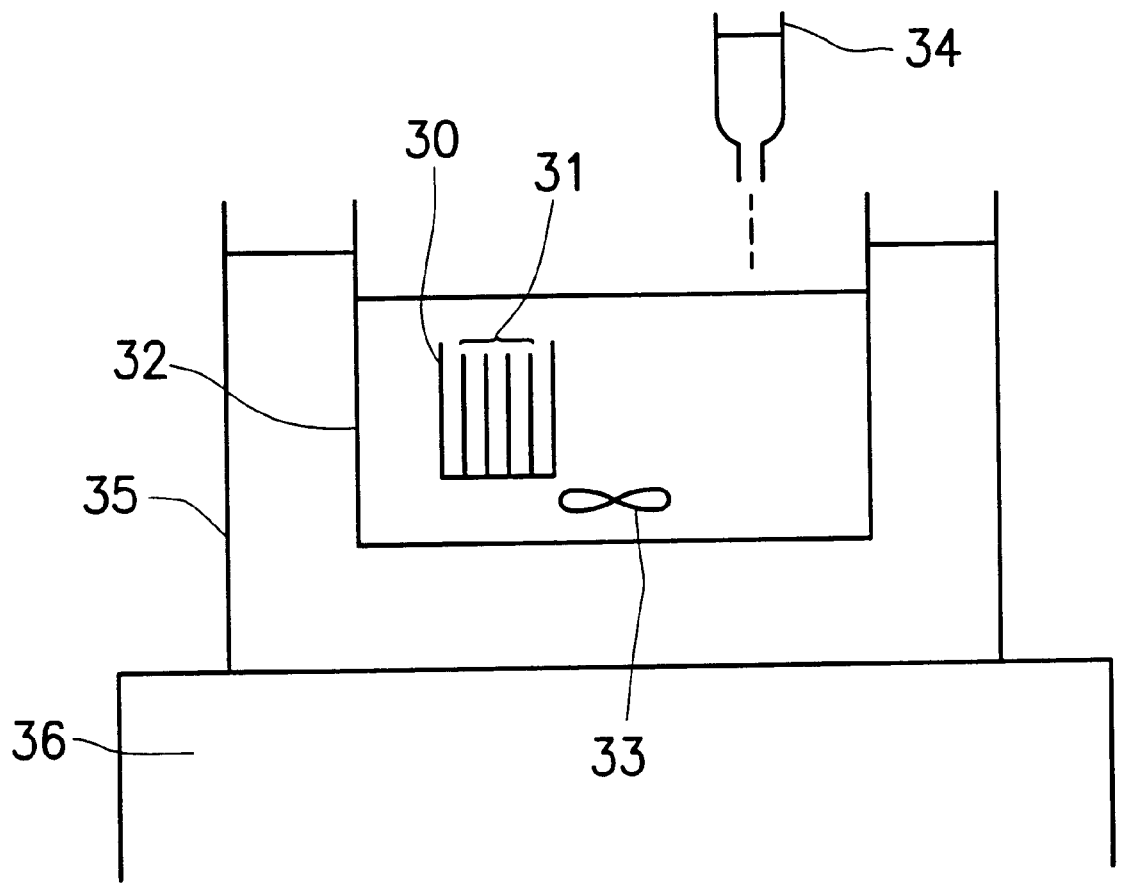
FIG. 3 is a simplified illustration of an apparatus for liquid-phase deposition.

The above-mentioned selective liquid-phase deposition can be illustrated by FIG. 3. A chip boat 30 is used for carry silicon chips 31. The chip boat 30 is posited in a reactor 32. In the reactor 32, saturated fluorosilicic acid ($H_2SiF_6$) is used for reaction and a stirrer 33 is used for stirring the above-mentioned solution. At the upper part of the reactor 32, an injector 34 carrying boric acid ($H_3BO_3$) is used for injecting boric acid into the reactor 32 to keep fluorosilicic acid saturated. The reactor 32 is situated in the water bath 35, assisted by a heater 36 to perform the liquid-phase deposition reaction. The chemical equations are as followed:

$$H_2SiF_6 + 2H_2O \leftrightarrows 6HF + SiO_2$$

$$H_3BO_3 + 4HF \leftrightarrows BF_4^- + H_3O^+ + 2H_2O$$

The liquid-phase deposition has an excellent selectivity. The oxide formed by the liquid-phase deposition posits only on the silicon oxide layer and the polysilicon layer but not on the surface of materials such as tungsten and photoresist.

Next, the photoresist layer on one of the source/drain regions of a MOS transistor is removed. The photoresist layer can be stripped by dry plasma.

Conventionally, the etching step for patterning the oxide layer results in a portion of the oxide layer residues on the oxide spacer of the contact window and covering a portion of the source/drain region. Consequently, the self-aligned contact shrinks and the contact resistance highly increases. Moreover, during the process of self-aligned patterning, oxide over-etching is usually required. The cap oxide on the gate electrode is also partially etched so that the cap oxide is not able to provide effective isolation between the gate electrode and the conductive layer. Since the design rule of integrated circuits is decreasing, the self-aligned contact window formation becomes even more difficult to control. In the present invention, photoresist is formed before the deposition of the oxide layer on the substrate. Consequently, the self-aligned contact window will not be hindered by the residue oxide so that the contact window resistance can be maintained low. Also, the cap oxide will not be etched. Thus, sufficient thickness of the cap oxide results in higher reliability of the device and yield.

Figure 2C:
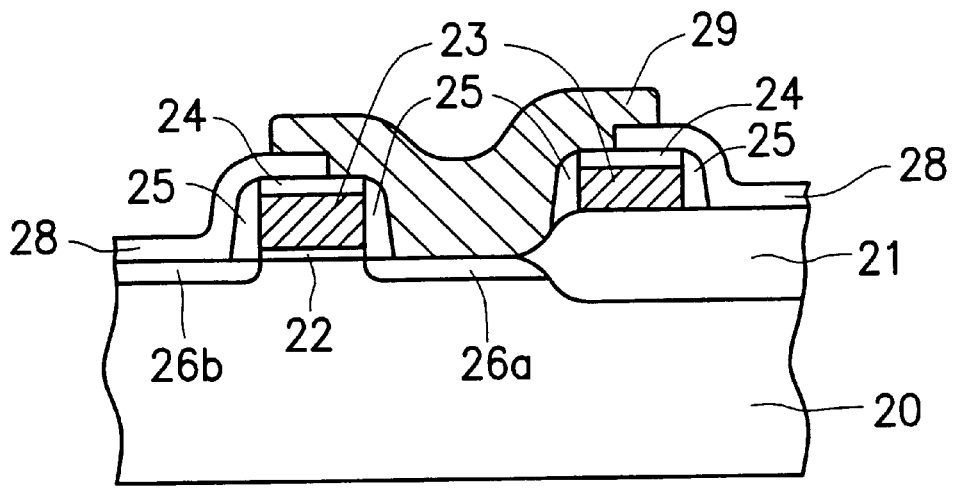

Referring again to FIG. 2C, a first conductive layer 29, such as polysilicon layer, is formed on the substrate and patterned to cover one of the source/drain regions 26a and to electrically couple with the source/drain region 26a. The polysilicon layer can be firstly formed by low pressure chemical vapor deposition (LPCVD) to have a thickness of about 1500–2500 Å and patterned. The polysilicon layer can be either doped during deposition or doped by ion implantation and anneal to complete an N-type polysilicon layer as a lower electrode of an DRAM device.

Figure 2D:
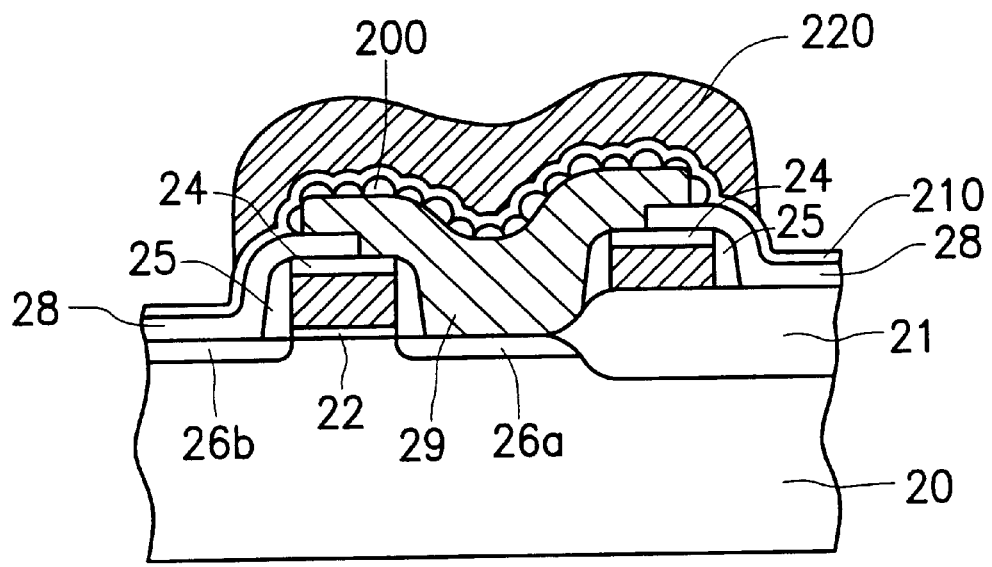

Referring to FIG. 2D, a hemi-spherical grain silicon (HSG-Si) layer 200 is formed on the first conductive layer 29. The HSG-Si layer 200 can be formed by any conventional proper method, for example, a low pressure chemical vapor deposition, using silane as gas source, in a temperature of about 550–595° C., at a pressure of about 0.2–0.5 torr, and forming HSG-Si rugged surface through HSG-Si nuclearation to increase the surface area of the lower electrode. On the HSG-Si layer, a dielectric layer 210 is formed. The dielectric layer 2 10 can be, for example, an oxide/nitride/oxide layer, which can be formed by chemical vapor depositing a thin silicon nitride layer on a native oxide layer and partially oxidating the surface of the silicon nitride layer. Preferably, the dielectric layer 210 can be a high dielectric constant material such as $Ta_2O_5$ or provskite dielectric. Then a blanket second conductive layer 220 such as a polysilicon layer can be formed on the dielectric layer 210 to form the upper electrode by, for example, LPCVD. The second conductive layer 220 can be doped either during its deposition or performing an extra ion implantation and annealing process. After patterning the second conductive layer 220 to be an upper electrode, the DRAM device is substantially completed.

While the invention has been described by way of example and terms of the preferred embodiment, it is to be understood that the invention is not limited thereto. To the contrary, it is intended to cover various modifications and similar arrangements. The appended claims, therefore, should be accorded the broadest interpretation so as to encompass all such modifications and similar arrangements.

What is claimed is:

1. A method of fabricating a dynamic random access memory, comprising:

providing a substrate with at least one active region, and at least one field oxide area formed thereon and adjacent to the active region;

forming a gate oxide layer on the active region;

depositing a polysilicon layer on the active region;

forming a cap oxide layer on the polysilicon layer;

patterning the cap oxide layers polysilicon layer and gate electrode layer to form a gate electrode structure of a MOS transistor;

forming sidewall spacers on sidewalls of the gate electrode structure;

performing a self-aligned ion implantation process in the substrate to form a plurality of source/drain regions;

forming a photoresist layer on the substrate, covering one of the source/drain regions of the MOS transistor and covering a part of the cap oxide layer of the gate electrode structure;

after said forming a photoresist layer, selectively forming an oxide layer on an exposed part of the gate electrode structure and on the substrate using liquid phase deposition; and removing the photoresist layer to expose the one of the source/drain regions, thereby forming a contact window over the one of the source/drain regions, wherein said forming a photoresist layer, said selectively forming and said removing prevents the oxide layer from forming within the contact window, and wherein said forming a photoresist layer, said selectively forming and said removing are performed without etching the cap oxide layer.

2. A method of fabricating a capacitor of a dynamic random access memory, transistor comprising:

provic a substrate with at least one active region and at least one field oxide area formed therein and adjacent to the active region;

forming a gate oxide layer on the active region;

depositing a first conductive layer on the active region;

forming a cap oxide layer on the first conductive layer;

patterning the cap oxide layer, the first conductive layer and gate oxide layer to form a gate electrode structure of a MOS transistor;

forming sidewall spacers on sidewalls of the gate electrode structure;

performing a self-aligned ion implantation process in the substrate to form a plurality of source/drain regions;

forming a mask layer on the substrate, the mask covering at least one of the source/drain regions and a part of the cap oxide of the gate electrode structure;

after said forming a mask layer, selectively forming an insulating layer on an exposed part of the gate electrode structure and on the substrate using liquid-phase deposition;

removing the mask layer, exposing the one of the source/drain regions, thereby forming a contact window over the one of the source/drain regions, wherein said forming a mask layer, said selectively forming and said removing prevents the insulating layer from forming within the contact window, and wherein said forming a mask layer, said selectively forming and said removing are performed without etching the cap insulating layer;

forming a second patterned conductive layer on the substrate, the second patterned conductive layer covering only a part of the insulating layer and being electrically coupled to the one of the source/drain regions to form a lower electrode of the capacitor;

forming a dielectric layer on the second conductive layer; and forming a third conductive layer on the dielectric layer to form an upper electrode of the capacitor.

3. A method as claimed in claim 2, wherein the insulating layer includes an oxide layer.

4. A method as claimed in claim 2, wherein after the step of forming the first conductive layer and before the step of forming the dielectric layer, a step of forming a hemi-spherical grain silicon layer is further performed.

5. A method as claimed in claim 2, wherein the second patterned conductive layer includes a doped polysilicon layer.

6. A method as claimed in claim 2, wherein the third conductive layer includes a doped polysilicon layer.

7. A method as claimed in claim 2, wherein the dielectric layer includes an oxide/nitride/oxide layer.

8. A method as claimed in claim 2, wherein the dielectric layer includes Provskite dielectric.

9. A method of fabricating a capacitor of a dynamic random access memory, the method comprising:

providing a substrate with at least one active region, and at least one field oxide area formed thereon;

forming a gate oxide layer on the active region;

depositing a polysilicon layer on the active region and elsewhere on the substrate;

forming a cap oxide layer on the polysilicon layer;

patterning the cap oxide layer, polysilicon layer and gate oxide layer to form a gate electrode structure of a MOS transistor;

forming sidewall spacers on sidewalls of the gate electrode structure;

performing a self-aligned ion implantation process in the substrate to form a plurality of source/drain regions;

before forming an oxide layer, forming a photoresist layer on the substrate, covering one of the source/drain regions and a part of the cap oxide layer of the gate electrode structure;

selectively forming the oxide layer over an exposed portion of the gate electrode structure and over the substrate surface;

removing the photoresist layer, thereby forming a contact window over the one of the source/drain regions, wherein said forming a photoresist layer, said selectively forming and said removing prevents the oxide layer from forming within the contact window, and wherein said forming a photoresist layer, said selectively forming and said removing are performed without etching the cap oxide layer;

forming and patterning a first polysilicon layer on the substrate, the first polysilicon layer being electrically coupled to the one of the source/drain regions to form a lower electrode of the capacitor;

forming a dielectric layer on the first polysilicon layer; and forming a second polysilicon layer on the dielectric layer to form a lower electrode of the capacitor.

10. A method as claimed in claim 9, wherein after the step of forming and patterning a first polysilicon layer and before the step of forming the dielectric layer, a step of forming a hemi-spherical grain silicon layer is further performed.

11. A method as claimed in claim 9, wherein the first polysilicon layer and the second polysilicon layer are doped with impurities.

12. A method as claimed in claim 9, wherein the dielectric layer includes an oxide/nitride/oxide layer.

13. A method as claimed in claim 9, wherein the dielectric layer includes $Ta_2O_5$.

14. A method as claimed in claim 9, wherein the selectively formed oxide layer is formed by liquid-phase deposition.

15. A method as claimed in claim 9, wherein the dielectric layer includes a provskite dielectric.

* * * * *